United States Patent [19]

Marin et al.

[11] 3,931,610
[45] Jan. 6, 1976

[54] CAPACITIVE KEYSWITCH SENSOR AND METHOD

[75] Inventors: Robert E. Marin, Park Ridge; Roger K. Simonson, Deerfield, both of Ill.

[73] Assignee: Teletype Corporation, Skokie, Ill.

[22] Filed: Nov. 29, 1973

[21] Appl. No.: 420,132

[52] U.S. Cl. ............ 340/172.5; 197/98; 235/92 CA; 235/92 T; 324/60 C; 324/60 CD; 340/365 C
[51] Int. Cl.²... B41J 5/08; G08C 9/00; G01R 17/02
[58] Field of Search ........ 235/92 MT, 92 T, 92 CA, 235/92 EL; 340/347 CC, 347 NT, 146.3 Z, 365 C; 324/28 R, 28 SE, 60 C, 60 CD, 98, 99 D, 60 R, 57 R; 197/98, 106, 107; 317/246, 249 R, 249 D

[56] References Cited
UNITED STATES PATENTS

| | | | |
|---|---|---|---|
| 2,963,697 | 12/1960 | Giel | 340/347 CC |
| 3,480,857 | 11/1969 | Bialko et al. | 324/60 R |
| 3,577,140 | 5/1971 | Aasnaes | 340/347 NT |
| 3,653,038 | 3/1972 | Webb et al. | 197/98 |
| 3,744,026 | 7/1973 | Wolff | 340/146.3 Z |
| 3,745,536 | 7/1973 | Klehm | 340/172.5 |
| 3,750,113 | 7/1973 | Cencel | 317/249 R |
| 3,761,736 | 9/1973 | Edge et al. | 340/365 C |
| 3,761,805 | 9/1973 | Dornberger | 324/60 C |
| 3,786,497 | 1/1974 | Davis et al. | 197/98 |
| 3,805,149 | 4/1974 | Delapierre | 324/60 C |
| 3,824,459 | 7/1974 | Uchida | 324/60 CD |

*Primary Examiner*—Leo H. Boudreau
*Attorney, Agent, or Firm*—W. K. Serp; J. L. Landis

[57] ABSTRACT

Each of the inputs of an analog multiplexer are connected to a plurality of capacitive keyswitches and a reference capacitor. At the first multiplexer scan position, the reference capacitor is charged through a charging resistor and when a predetermined voltage is reached a threshold amplifier is caused to respond. The time period required to charge the reference capacitor is stored and compared with the time period required to charge each of the keyswitches. A control signal is generated in response to this comparison providing a signal representative of the capacitive value of the keyswitch in relation to the reference capacitor and thus the operative condition of the keyswitch.

18 Claims, 2 Drawing Figures

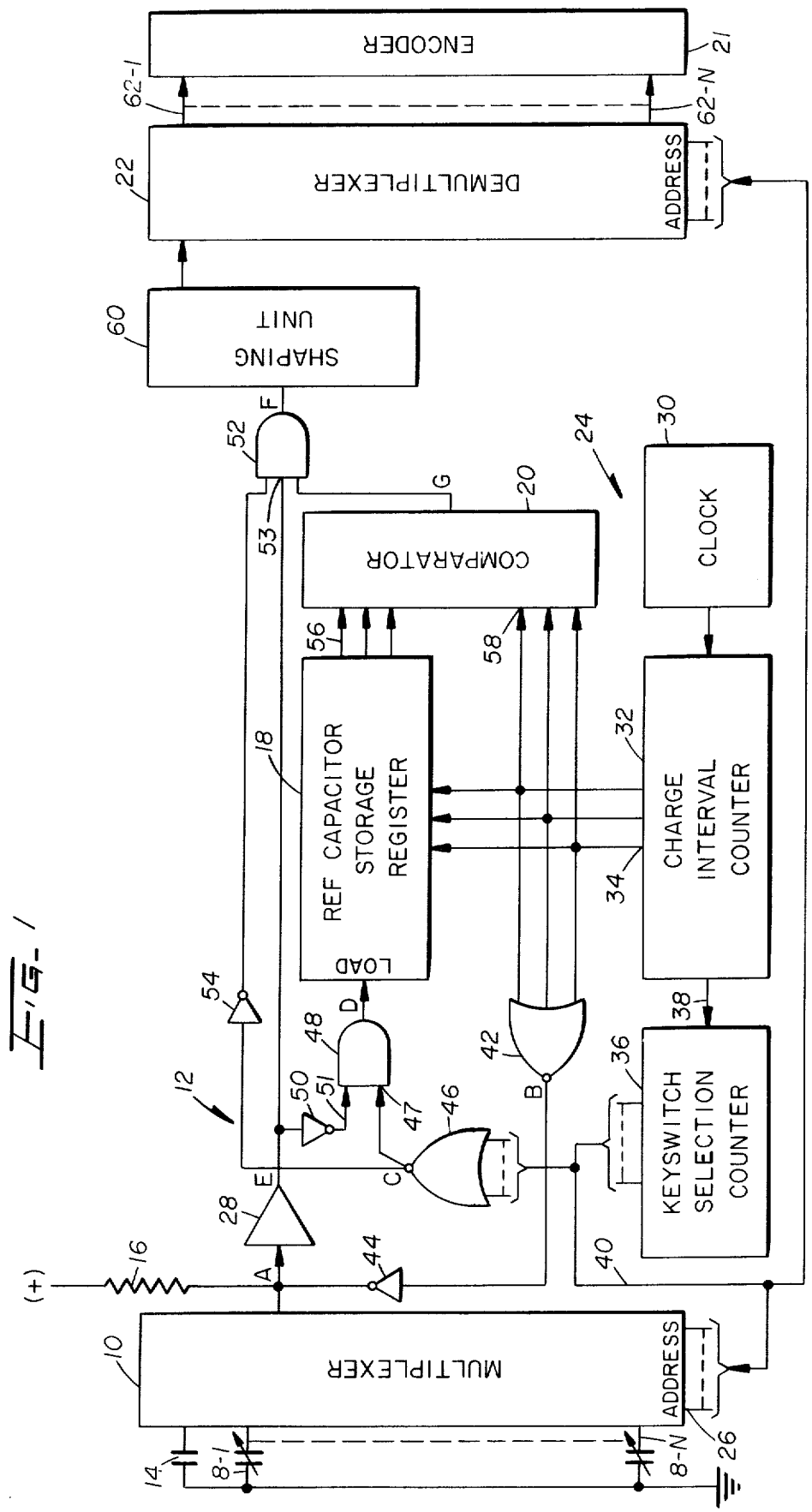

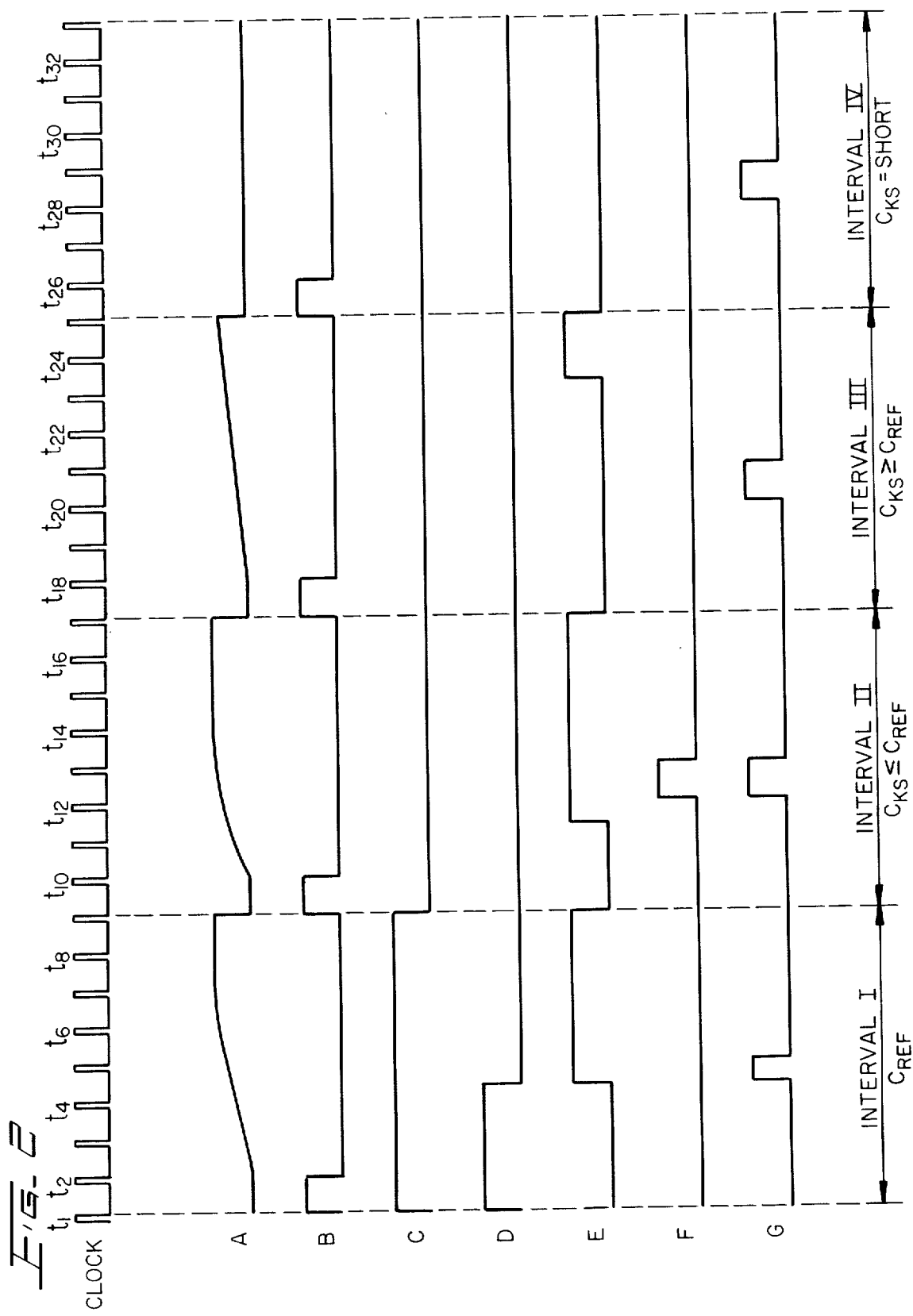

3,931,610

CAPACITIVE KEYSWITCH SENSOR AND METHOD

FIELD OF THE INVENTION

This invention generally relates to a sensor for a capacitive keyswitch providing a signal related to the operative condition of the keyswitch and more particularly relates to such a sensor which is relatively uneffected by the adverse effects of temperature excursions, aging, voltage variations, and component processing parameters.

BACKGROUND OF THE INVENTION

A wide variety of manually operable devices have been suggested for use as keyswitches forming component parts of a keyboard. Various mechanical as well as magnetically operable switches are in current use. A form of keyswitch which is finding increased utilization is the capacitively operated switch such as the device described in U.S. Pat. No. 3,671,822 issued June 20, 1972, to Theodore M. Leno entitled "Variable Capacitive Apparatus". The referenced switch includes a pair of conductive plates spaced to form a capacitor. The separation of the plates and thus their mutual capacitance is altered in response to manual actuation of a keytop. In response to the capacitance change a closure signal is generated which is processed by an encoder converting the signal, which is scan position related, into another notation such as binary or ASCII. The keyswitches are electronically scanned at a high rate and means are often provided for producing a single control signal representative of an actuated key regardless of the number of times the actuated keyswitch is scanned.

With continued reference to such keyswitches, the capacitive value of the keyswitch is sensed and this measure is utilized to determine the state of the sampled keyswitch. The sensing circuitry is frequently implemented with TTL or MOS logic elements. Such logic elements exhibit varying characteristics as a result of aging, temperature, voltage variations and processing parameters; the results of which may adversely affect the reliability of the sensing circuitry. MOS logic elements are particularly susceptible to such conditions. The illustrated embodiment serves to sense the operative condition of a capacitive keyswitch so as to produce reliable operation relatively unaffected by manufacturing and environmental conditions to which the various components forming the apparatus are subjected.

SUMMARY OF THE INVENTION

An apparatus and method for sensing the operative condition of a plurality of capacitive keyswitches forming a keyboard. Each keyswitch is operable between a first condition and a second condition. Included are a reference capacitor and means for sequentially measuring the capacitive value of the reference capacitor and each of the keyswitches. The measuring means provides a first informational signal related to the value of the reference capacitor and a second informational signal related to the value of a selected keyswitch. The first informational signal is stored. The stored signal is compared with the second informational signal related to the capacitive value of a selected keyswitch and a control signal is generated in response thereto. This control signal serves as an indication of the capacitive value of the selected keyswitch relative to the capacitive value of the reference capacitor thus indicating the operative condition of the keyswitch.

A main purpose of this invention is to provide a system for sensing the operative condition of a capacitive keyswitch such apparatus being relatively insensitive to temperature excursions, component aging, variations in system voltage levels and component processing parameters.

Other objects, advantages, and features of this invention will be more readily appreciated after reference to the following description and accompanying drawings.

DESCRIPTION OF THE DRAWINGS

FIG. 1 is a schematic diagram of a keyswitch sensing apparatus including certain features of this invention.

FIG. 2 is a timing diagram illustrating certain of the signal levels generated by the apparatus of FIG. 1.

DESCRIPTION OF THE ILLUSTRATED EMBODIMENT

General

With particular reference to FIG. 1, a plurality of manually actuable capacitive keyswitches 8-1 through 8-N are illustrated. Each keyswitch 8 consists of two conductive metallic plates spaced by a dielectric. In its non-actuated condition, the keyswitches 8 exhibit a maximum value of capacitance and upon depression this capacitance value is decreased. The keyswitches 8 are scanned by switching means in the form of an analog multiplexer. The output of the multiplexer 10 is fed to a capacitive measuring means 12 by which the capacitive value of each of the keyswitches as well as that of a reference capacitor 14 is sequentially measured. These capacitive values are determined by measuring the time interval necessary to charge a selected capacitor to the response voltage of amplifier 28 through a charging resistor 16. The charging time interval for the reference capacitor 14 is stored in a reference storage register 18. The output of the reference register 18 is fed to a comparator 20 and as the multiplexer 10 sequentially samples each of the capacitive keyswitches, the time duration required to charge the sampled keyswitch 8 is compared with the time duration required to charge the reference capacitor 14, as recorded by the reference storage register 18. In effect, the operative condition of a sampled keyswitch 8 is determined by comparing its capacitive value with the value of the reference capacitor 14. An output signal from the comparator is fed to the input of a digital demultiplexer 22 the operation of which is synchronized with the analog multiplexer 10. The multiple output of the demultiplexer 22 is fed to an encoder 21 which serves to convert the scan related signals from the keyswitches 8 to a binary or ASCII code as desired. Timing circuitry 24 is included which provides the clocking signals for synchronizing the operation of the apparatus as will hereinafter be further considered.

Capacitance Measurement

As mentioned, each capacitive keyswitch 8 consists of two conductive plates spaced by a dielectric. The keyswitches 8 present a maximum capacitance in the deactuated condition. As illustrated, one of the plates or electrodes of each keyswitch 8 is connected to ground potential and the remaining plate is connected to a selected input of the analog multiplexer 10. The multiplexer 10 switches N+1 positions where N is the number of keyswitches utilized. The fixed capacitor 14 serves to supply a reference capacitance value, which is used for comparison with the value of each of the keyswitches 8 to determine their operative state. The capacitor 14 is selected to exhibit close tolerance characteristics and good stability under normal environmental conditions. The value of the fixed capacitor 14 is selected to lie midway between the open and closed capacitance value of the keyswitches 8. The reference capacitor 14 is connected to the first sampled input of the multiplexer 10 and the remaining terminal thereof connected to ground potential. The analog multiplexer 10 is addressed by a binary code generated by the timing unit 24 fed to multilevel address inputs 26 of the multiplexer 10. Serving to individually charge each of the capacitive keyswitches 8 and the reference capacitor 14, is the charging resistor 16 connected between the output port of the multiplexer 10 and the positive source of the supply. The value of the charging resistor 16 will be subsequently considered in greater detail. As the reference capacitor 14 and each of the keyswitches 8 are switched by the multiplexer 10 to the charging resistor 16, they are charged. Serving to measure the voltage across a selected keyswitch 8 or the reference capacitor 14 is a threshold amplifier 28. The characteristics of the amplifier 28 are such that it is caused to respond when the input voltage designated A exceeds the threshold level. Thus, when the voltage level at the output of the multiplexer 10 reaches a predetermined value the output of the amplifer 28 goes high.

The timing unit 24 includes a clock generator 30 which serves as a basic timing reference for the apparatus. Output pulses from the clock 30 are fed to a charge interval counter 32 providing three binary output levels at ports 34. As will be appreciated, the 3 level binary output provides a count of eight before recycling. The reference resistor 16 is selected in relation to the clock frequency. The resistor 16 value is preferably such that the reference capacitor 14 will charge to the threshold level of the amplifier 28 in approximately the time duration required for one half of the counter 32 cycle. This resistor selection allows the apparatus to provide the greatest compensation for environmental and processing variations. It will be appreciated that relative timing frequencies and component values are provided by way of illustration and may be varied without departing from the scope and spirit of this invention. The carry output from the charge interval counter 32 feeds the input of a keyswitch selection counter 36 via line 38. The keyswitch selection counter 36 provides a multilevel binary output via cable 40 to the address ports 26 of the multiplexer 10. The binary count provided at the output of the counter 36 is sufficient to sequentially switch the multiplexer 10 to the reference capacitor 14 and each of the keyswitches 8. Thus, the keyswitch selection counter 36 steps once for each cycle of the interval counter 32 and the interval counter 32 cycles once for each multiplexer 10 position.

The binary output from the charge interval counter 32 is also fed to inputs of a triple input discharge decode NOR-gate 42. It will be appreciated that when all of the outputs of the charge interval counter 32 are low corresponding to the first count of the counter, the output of the NOR-gate 42 will be high designated signal level B. For all of the remaining counter levels at least one input will be high and the NOR-gate 42 output low. Thus, the gate 42 serves as a means for decoding a particular count of the charge interval counter 32 which occurs once for each complete cycling thereof when the analog multiplexer 10 is initially switched to a selected position. The output of the NOR-gate 42 is connected to the input of a discharge inverter 44, the output thereof being connected to the output of the analog multiplexer 10. The charge resistor 16 serves as the load resistor for the inverter 44. Thus, when the charge interval counter 32 cycle starts, the first count finds all of the binary outputs 34 low, driving the output of the discharge decode gate 42 high and correspondingly the output of the discharge inverter 44 low. In this manner, the first count pulls the output of the analog multiplexer 10 low, dumping any residual charge which may have collected upon the capacitor being sampled. As the counter 32 continues to count through its cycle, the output of the discharge decode NOR-gate 42 goes low, driving the output of the discharge inverter 44 high effectively removing it from the output of the multiplexer 10. This allows the selected keyswitch 8 or the reference capacitor 14 connected to the output thereof to charge sequentially through the charging resistor 16.

Storage and Comparison

Serving to decode the binary output of the keyswitch selection counter 36, is a reference capacitor decode NOR-gate 46. Each output, via cable 40, from the counter 36 is coupled to one input of the NOR-gate 46. The output of the gate 46, designated signal level C, is fed to one input of a storage register dual input AND-gate 48. It will be appreciated that when the binary output of the keyswitch selection counter is low, the output of the decode gate will be high, placing a high level at the input to the AND-gate 48, allowing the output signal D thereof to follow the signal on the remaining AND-gate 48 input. As previously mentioned, the multiplexer 10 coding is such that when all of the output levels of the keyswitch selection counter 36 are all low, corresponding to the first count, the reference capacitor 14 is connected to the output of the multiplexer 10. When reference capacitor 14 is connected to the input of the threshold amplifier 28 and when the voltage across the reference capacitor 14 reaches the threshold of the amplifier 28, the amplifier 28 abruptly conducts feeding a signal E through an inverter 50 to the remaining input 51 of the AND-gate 48. The simultaneous occurrence of two high signals at both inputs of the storage register AND-gate 48 cause the output D thereof to go high feeding a load signal to the reference capacitance storage register 18. The register loads with the output of the charge interval counter on the falling edge of the input pulse. It will be appreciated that this loaded binary count from the charge interval counter 32 is representative of the time duration between the discharge of the reference capacitor and the charge across the capacitor reaching the threshold voltage of the amplifier 28. The output of the threshold amplifier 28 is also fed to one input 53 of a triple input AND-gate 52, an alternate input of which is fed through an inverter 54 from the output of the referenced capacitor decode gate 46. Thus, when the output of the reference capacitor decode gate 46 goes high, the input of the triple input AND-gate 52 will be brought low, holding the output signal F of the gate low. This feature prevents the generation of an output signal when the value of the reference capacitor 14 is being measured.

The multilevel output of the storage register 18 is fed, via lines 56, to the inputs of the comparator 20. The remaining multilevel input 58 of the comparator is fed from the output of the charge interval counter 32. When the two input levels coincide, the comparator 20 feeds a control signal G to the remaining input of the AND-gate 52. The operation of the comparator will be subsequently further described in connection with the description relating to the timing diagram of FIG. 2. Serving to shape the output F of the AND-gate 52 is a shaping unit 60 which may be a one-shot multivibrator or other suitable device. The output of the shaping unit 60 is fed to the input of the digital demultiplexer 22. Serving to address the demultiplexer 22 are the binary outputs from the keyswitch selection counter 36 fed via the cable 40. Thus, the operation of the demultiplexer 22 is synchronized with that of the analog multiplexer 10. The demultiplexer 22 provides a plurality of outputs 62-1 through 62-N each of which corresponds to one of the keyswitches 8-1 through 8-N. Thus, when the multiplexer 10 selects a particular keyswitch 8 for capacitance measurement, the demultiplexer 22 is connected to the corresponding input of the encoder 21. As mentioned, the encoder 21 serves to convert the scan related keyswitch signals from the demultiplexer 22 to binary or ASCII code as desired.

Timing

With particular reference to FIG. 2, the various voltage levels mentioned in the preceding discussion are illustrated with respect to four exemplary positions of the multiplexer 10. The first multiplexer position, designated Interval I, is with respect to the measurement of the time duration necessary to charge the reference capacitor 14 to a predetermined level. The second position, Interval II, illustrates the sampling of a keyswitch 8 which has been depressed, thus providing a capacitive value which is less than that of the reference capacitor 14. The third position, Interval III, is with respect to a non-actuated keyswitch 8 wherein the keyswitch capacitance is greater than the capacitance value of the reference capacitor 14 and Interval IV pertains to the condition wherein the capacitive plates of the keyswitch 8 are shorted due to failure of the dielectric or insufficient spacing between the plates where air is the dielectric. It will be appreciated after review of the following discussion that the shorting of the capacitive plates of the keyswitch 8 in its deactuated condition does not interfere with the operation of the apparatus. Rather, this condition is sensed as though the keyswitch 8 presented a relatively high capacitance indicating a normally non-actuated keyswitch.

The output of the clock 30 is illustrated in relation to the other signal levels, A through F, generated by the apparatus of FIG. 1. As mentioned, a complete capacitance measurement cycle occurs in eight clock pulses corresponding to one cycle of the charge interval counter 32. At time $t_1$ the charge interval counter starts a cycle with all output levels low and signal level B at the output of the discharge decode gate 42 goes high driving the output of the inverter 44 low, thus bleeding off any residual charge which may have collected on the reference capacitor 14. The presence of such residual charge could introduce error into the measurement. In response to the falling edge of the second clock pulse at $t_2$, the charge interval counter 32 steps. The output of the discharge inverter 44 goes high and the reference capacitor 14 starts to charge through the charging resistor 16. As illustrated by curve A, the reference capacitor is allowed to charge until the trailing edge of clock pulse $t_9$. When the threshold voltage of the amplifier 28 is exceeded, which occurs in the illustration between times $t_4$ and $t_5$, the amplifier 28 output goes high as in curve E and remains high throughout the continued charging of the reference capacitor 14. The time duration $t_1-t_{4-1/2}$ is the interval required for the reference capacitor to charge to the threshold level of the amplifier. As previously mentioned, the binary address coding of the multiplexer is such that the reference capacitor is being sampled when all of the outputs from the keyswith selection counter are low. This zero binary code level is fed to the inputs of the reference capacitor decode NOR-gate 46 causing the output voltage C to remain high throughout the reference capacitor interval $(t_1-t_9)$ placing a high signal to the input 47 of the storage register AND-gate 48. At $t_{4-1/2}$ the input 51 of the AND-gate 48 goes low due to the high signal at the output of the inverter 50. The negative going edge of the input signal D to the register 18 causes it to load with the binary count of the interval counter 32. In response to loading of the register 18, the comparator 20 provides a conicidence signal G during the period $t_{4-1/2}-t_5$ which terminates at the next negative going clock signal at $t_5$. It will be noted that the output F from the output AND-gate which is fed to the shaping unit is low throughout Interval I due to the inversion of the high signal C from the decode gate through the inverter 54 applied to the AND-gate 52 input. This feature prevents an output signal from being generated during measurement of the reference capacitor 14.

As mentioned, during Interval II, the analog multiplexer 10 is sampling an actuated keyswitch 8 which presents a capacitance level less than the value of the reference capacitor 14. At the start of Interval II, all of the charge interval counter 32 binary output levels are low pulling the input of the discharge amplifier 28 low thus removing any residual charge which may have collected upon the sampled keyswitch 8. At time $t_{10}$ signal B goes low causing the output of the inverter to go high thus allowing the sampled keyswitch 8 to charge through the charging resistor 16. It will be noted that the rate of voltage increase of signal A during Interval II is considerably faster than the rate of increase across the reference capacitor 14 during Interval I, reflecting a relatively smaller capacitance value. When the voltage level across the sampled keyswitch 8 reaches the threshold of the amplifier 28 which occurs between time $t_{11}$ and $t_{12}$, the amplifier output E goes high pulling the input to the output AND-gate 52 high. It will be noted that at this time the count of the charge interval counter 32 output is less than the count stored in the reference storage register 18. Therefore the output of the comparator remains low holding the output level F low. In response to a coincidence between the storage register 18 count and the charge interval counter which occurs at time $t_{12}$, the comparator output G goes high for the period $t_{12}-t_{13}$. During this period all of the inputs to the output AND-gate 52 are high generating an output pulse F to the shaping unit 60, which is demultiplexed to the appropriate input of the encoder 21.

Interval III illustrates the sampling of a non actuated keyswitch 8 exhibiting a high capacitive value. At time $t_{17}$ the output B of the discharge gate 42 goes high discharging the sampled non-actuated keyswitch 8 for the duration $t_{17}-t_{18}$. Thereafter, the keyswitch 8 is charged through the reference resistor 16 as illustrated by signal level A. It will be noted that in this instance the voltage rise across the keyswitch is much slower than with respect to the charging rate of the reference capacitor 14 during Interval I. At $t_{20}$ the binary output level from the charge counter 32 and the binary level stored in the register 18 coincide. In response to this coincidence, the comparator 18 generates an output pulse during time period $t_{20}-t_{21}$. As illustrated, during this period, the signal E from output E of the threshold amplifier 28 is low since the voltage across the keyswitch 8 has not reached the threshold level of the amplifier 28. Shortly after clock pulse $t_{23}$, the voltage across the sampled non-actuated keyswitch 8 reaches the threshold level of the amplifier 28 and signal E goes high feeding a high signal to the input 53 of the AND-gate 52. However, at $t_{23}$ the output signal G from the comparator 58 is low. During Inteval III, the comparison pulse from the comparator and the output from the amplifier did not coincide. Thus, output signal F remains low throughout Interval III and the sampled keyswitch 8 is sensed as a non-actuated switch.

As mentioned, Interval IV, pertains to the sensing of a non-actuated sampled keyswitch 8 wherein the capacitive plates are shorted. In response to signal B from the discharge decode gate 42 at time $t_{25}$, the discharge inverter 44 discharges the keyswitch 8. However, since the capacitive plates of the keyswitch 8 are shorted no residual charge will be dumped. In response to the next clock pulse at $t_{26}$, the charge interval counter 32 steps and the output of the inverter 44 goes high allowing the sampled keyswitch 8 to charge through the resistor. As illustrated by curve A, a low voltage level is maintained throughout the charging period since the sampled keyswitch 8 plates are shorted. In this condition, the voltage level across the keyswitch 8 does not reach the level of the threshold amplifier 28; and therefore the signal level at the input 53 of the AND-gate 52 remains low throughout Interval IV. When the charge interval counter 32 output and the binary count stored in the storage register 18 coincide, the comparator 20 feeds an output pulse, signal G, for the period $t_{28}$ through $t_{29}$ to the input of the AND-gate 52. However, since the input to the threshold amplifier 28 is maintained low throughout Interval IV, signal level F remains low. Thus, as previously mentioned, a shorted keyswitch is sensed as a non-actuated keyswitch.

Operation

It will be appreciated that the illustrated embodiment scans each of the capacitive keyswitches 8 in sequences with the first scan position sampling the reference capacitor 14. When the analog demultiplexer 10 is switched to the reference capacitor 14, the capacitor 14 is first discharged and then allowed to charge through the charging resistor 16 until the threshold voltage of the amplifier 28 is reached. At this time the binary count of the charge interval counter 32 is stored in the storage reference register 18. This count is representative of the time period which has expired from the discharge of the capacitor 14 until the voltage thereacross has reached the threshold voltage of the amplifier 28. As each of the remaining capacitive keyswitches 8 are sampled, the charge time of each is compared to that of the reference capacitor. In the event the charge time is less than the reference capacitor 14 charge time, an actuated keyswitch signal is fed through the demultiplexer 22 to the encoder 21. If the keyswitch 8 is non-actuated, exhibiting a high capacitive value or a shorted condition, a low signal condition is maintained at the respective input of the encoder 21. It will be appreciated that since the apparatus measures the reference capacitor 14 for each complete scan of the keyswitches 8-1 through 8-N, the storage register 18 is constantly updating to adjust to variations in the supply voltage, component aging, and temperature variations, which may occur. Further, within reasonable limitations, the apparatus compensates for manufacturing process tolerances. Thus, a highly reliable sampling of the operative condition of each of the keyswitches is obtained, producing consistent results over wide variations of environmental conditions.

While this invention has been particularly shown and described with reference to the preferred embodiment thereof, it will be understood by those skilled in the art that various changes in form and detail may be made without departing from the scope and spirit of the invention.

What is claimed is:

1. The method of repetitively determining whether each of a plurality of capacitive keyswitches is actuated or deactuated during each of a plurality of keyswitch-scanning cycles, the keyswitches being of the type which change from a first capacitance value to a second capacitance value when the keyswitch is actuated, which comprises:
   prior to the start of each keyswitch-scanning cycle, sampling the capacitance of a reference capacitor having a capacitance value approximately midway between the first and second values of the keyswitches, with a capacitance testing circuit, and generating a first data signal having a parameter which is a function of the sampled capacitance of the reference capacitor;
   next, sequentially sampling the capacitance of each successive keyswitch with the same testing circuit and under the same testing conditions, and generating a second data signal having a corresponding parameter which indicates the capacitance of each individual keyswitch in the sequence relative to the reference capacitor; and then
   comparing the second data signal with the first data signal, and generating an output control signal whenever the comparison of the second data signal with the first data signal indicates that one of the keyswitches exhibits the second capacitance value thus indicating that the corresponding keyswitch has been actuated.

2. The method as recited in claim 1, wherein the sampling steps include applying a charging voltage to first the reference capacitor and then to the individual keyswitches in a timed sequence, and detecting the time that it takes for first the reference capacitor and then for each keyswitch in sequence to charge to a predetermined reference potential, the charge time for the reference capacitor being measurably different from and approximately midway between the charge times for actuated and deactuated keyswitches, the first and second data signals being generated in response to the respective detected charge times.

3. The method as recited in claim 2, wherein:
   the step of generating the first data signal comprises generating a first binary information signal which changes state at a time during a first testing interval for the reference capacitor set by the charge time of the reference capacitor;

the step of generating the second data signal comprises generating a second binary information signal having a plurality of successive segments equal in duration to the first testing interval, where the second binary signal changes state during each successive segment of the second signal at a time corresponding to the state of a corresponding keyswitch; and the step of comparing the second data signal with the first comprises comparing the first binary information signal with each segment of the second signal, and detecting a preset coincidence between the two indicating that a particular keyswitch has been actuated.

4. The method as recited in claim 3, wherein information representing the first binary information signal is stored for the entire scanning cycle, and is regenerated during each testing cycle of the keyswitches for comparison with each successive segment of the second information signal.

5. A method for determining the operative condition of a capacitive keyswitch forming a component part of a keyboard said keyswitch being operable between a first condition and a second condition, comprising the steps of:

charging a reference capacitor to a predetermined level;

measuring the time interval required to charge the reference capacitor to the predetermined level;

charging a keyswitch to said predetermined level;

measuring the time interval required to charge the keyswitch to said predetermined level; and comparing the reference capacitor charge time interval with the keyswitch charge time interval so as to determine the relative capacitive value of the keyswitch with respect to the capacitive value of the reference capacitor.

6. The method of claim 5 which further comprises the steps of:

discharging the reference capacitor prior to the charging thereof so as to remove any residual charge thereon which might interfere with the measurement thereof.

7. The method of claim 5 which further comprises the step of:

discharging the keyswitch prior to the charging thereof so as to remove any residual charge thereon which might interfere with the measurement thereof.

8. An apparatus for sensing the operative condition of a plurality of capacitive keyswitches forming a keyboard, each keyswitch being operable between a first condition and a second condition comprising:

a reference capacitor;

means for measuring the capacitive value of said reference capacitor and providing a first informational signal related to the value of said reference capacitor and for measuring the capacitive value of a selected keyswitch and providing a second information signal related to the capacitive value of said selected keyswitch;

means for storing said first informational signal related to the value of said reference capacitor;

means for comparing said stored first informational signal with said second informational signal related to the capacitive value of said selected keyswitch and providing a control signal in response thereto, said control signal serving as an indication of the operative condition of said selected keyswitch; and said measuring means including means for charging said reference capacitor and said selected keyswitch, and voltage sensitive means selectively responsive to the charge upon said reference capacitor and said keyswitch, said voltage sensitive means serving to determine said first and second informational signals in response thereto.

9. The apparatus of claim 8 wherein said measuring means includes means for determining the time interval necessary to charge said reference capacitor and said selected keyswitch to a predetermined voltage level, said first informational signal being related to the time interval necessary to charge said reference capacitor to a predetermined voltage level; and said second informational signal being related to the time interval necessary to charge said keyswitch to a predetermined voltage level.

10. The apparatus of claim 9 wherein said time interval means includes a clock and a first counter driven by said clock; said storing means including a storage register for storing the level of said first counter as it relates to the time interval necessary to charge said reference capacitor to a predetermined level.

11. The apparatus of claim 10 which further includes means for discharging said reference capacitor prior to the charging thereof so as to remove any residual charge which might interfere with the measurement of said reference capacitor.

12. The apparatus of claim 11, including means for discharging said keyswitch prior to the charging thereof so as to remove any residual charge which might interfere with the measurement of said keyswitch capacitance.

13. The apparatus of claim 11 which further includes switching means for sequentially connecting each of said keyswitches and said reference capacitor to said measuring means, a second counter driven by said first counter upon completion of a predetermined counting cycle, said second counter serving to control said switching means wherein said first counter steps through an entire cycle for each position of said switching means.

14. The apparatus of claim 13 which further includes gating means responsive to said second counter when said switching means connects said reference capacitor to said charging means, said gating means serving to direct loading of said storage register with the level of said counter which is a signal level representative of the time interval for charging said reference capacitor to a predetermined level.

15. The apparatus of claim 14 which further includes second gating means responsive to the output of said comparing means, and said measuring means serving to provide a signal representative of the capacitive value of a selected keyswitch with respect to said reference capacitor.

16. The apparatus of claim 15 which further includes second switching means synchronized with said first switching means and providing a plurality of outputs corresponding to each of said keyswitches, the input of said second switching means being coupled to the output of said second gating means.

17. The apparatus of claim 15 which further includes means for shaping the output of said second gating means, the output of said shaping means being coupled to the input of said second switching means and converting same to a desired code.

18. Apparatus for repetitively determining whether each of a plurality of capacitive keyswitches is actuated or deactuated during each of a plurality of keyswitch-scanning cycles, the keyswitches being of the type which change from a first capacitance value to a second capacitance value when the keyswitch is actuated, which comprises:

a reference capacitor having a capacitance value approximately midway between the first and second values of the keyswitches;

means for sampling the capacitance of the reference capacitor prior to the start of each keyswitch-scanning cycle during a first testing interval, and for sequentially sampling the capacitance of each successive keyswitch under the same testing conditions during subsequent testing intervals;

means for generating a first data signal having a parameter which is a function of the sampled capacitance of the reference capacitor;

means for generating a second data signal having a corresponding parameter which indicates the capacitance of each individual keyswitch in the sequence relative to the reference capacitor; and means for comparing the second data signal with the first data signal, and for generating an output control signal whenever the comparison of the second data signal with the first data signal indicates that one of the keyswitches exhibits the second capacitance value, thus indicating that the corresponding keyswitch has been actuated.

* * * * *